(12) United States Patent
Jang et al.

(10) Patent No.: US 7,133,088 B2
(45) Date of Patent: Nov. 7, 2006

(54) LIQUID CRYSTAL DISPLAY DEVICE AND METHOD OF FABRICATING THE SAME

(75) Inventors: Sang-Min Jang, Gyeonggi-Do (KR); Su-Seok Choi, Gyeonggi-Do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/603,931

(22) Filed: Jun. 26, 2003

(65) Prior Publication Data

US 2004/0119897 A1    Jun. 24, 2004

(30) Foreign Application Priority Data

Dec. 23, 2002  (KR)  ............... 10-2002-0082698
Dec. 23, 2002  (KR)  ............... 10-2002-0082708

(51) Int. Cl.
*G02F 1/1333*  (2006.01)
*G02F 1/1343*  (2006.01)
*G02F 1/136*   (2006.01)

(52) U.S. Cl. ................. 349/43; 349/38; 349/46; 349/141; 349/143

(58) Field of Classification Search ............ 349/38, 349/41–43, 46, 158, 160, 141, 143
See application file for complete search history.

(56) References Cited

U.S. PATENT DOCUMENTS

| | | | | |
|---|---|---|---|---|
| 5,517,342 | A * | 5/1996 | Kim et al. | ............ 349/43 |
| 6,770,908 | B1 * | 8/2004 | Sato | ............ 257/59 |
| 6,900,852 | B1 * | 5/2005 | Okada et al. | ............ 349/39 |

* cited by examiner

*Primary Examiner*—Tarifur R. Chowdhury
(74) *Attorney, Agent, or Firm*—McKenna Long & Aldridge LLP

(57) ABSTRACT

A liquid crystal display device includes a plurality of data lines arranged along a first direction on a substrate, a plurality of gate lines arranged a second direction perpendicular to the first direction on the substrate to define a plurality of pixel regions, each of the gate lines having at least one first set of protrusions and depressions, a driving device within each of the pixel regions, a pixel electrode within each of the pixel regions, and a metal layer overlapping each of the gate lines to create a storage capacitor.

38 Claims, 7 Drawing Sheets

LIQUID CRYSTAL DISPLAY DEVICE AND METHOD OF FABRICATING THE SAME

The present invention claims the benefits of Korean Patent Application Nos. 82698/2002 and 82708/2002 both filed in Korea on Dec. 23, 2002, which are hereby incorporated by reference.

BACKGROUND OF THE INVENTION

1. Field of the Invention

The present invention relates to a display device and a method of fabricating a display device, and in particular to a liquid crystal display device and a method of fabricating a liquid crystal display device.

2. Description of the Related Art

In display devices, particularly, in flat panel display devices, such as liquid crystal display devices, active devices, such as a thin film transistors (TFTs) are arranged within pixel regions to drive the display device using an active matrix driving method. In the active matrix driving method, the active devices are disposed within each pixel region and are arranged in a matrix configuration to drive corresponding pixels.

FIG. 1 is a plan view a liquid crystal display device according to the related art. In FIG. 1, a liquid crystal display device 1 includes an N×M-number of pixels arranged along horizontal and vertical directions, wherein each pixel includes a TFT 10 formed at a cross region of a gate line 3 for receiving a scan signal from an external driving circuit and a data line 5 for receiving an image signal. The TFT 10 includes a gate electrode 12 connected to the gate line 3, a semiconductor layer 14 on the gate electrode 12 that is activated by the scan signal supplied to the gate electrode 12, and a source electrode 16 and a drain electrode 17 on the semiconductor layer 14. A pixel electrode 28 is formed within a display portion of the pixel region, and is connected to the drain electrode 17 to supply the image signal to a liquid crystal material layer (not shown). In addition, a storage capacitor metal layer 7 is formed to overlap the gate line 3 and is arranged along the horizontal direction of the gate line 3 to provide a storage capacitance for the liquid crystal display device 1.

FIG. 2 is a cross sectional view along I–I' of FIG. 1 according to the related art. In FIG. 2, the gate electrode 12 of the TFT 10 (in FIG. 1) and the gate line 3 are disposed on a first substrate 20, which is made of a transparent insulating material, such as glass, and a gate insulating layer 22 is deposited over an entire surface of the first substrate 20. The semiconductor layer 14 is formed on the gate insulating layer 22, and the source electrode 16 and the drain electrode 17 are formed thereon to form the TFT 10 (in FIG. 1). In addition, the storage capacitor metal layer 7 is disposed on the gate insulating layer 22 so that the gate insulating layer 22 is sandwiched between the storage capacitor metal layer 7 and the gate line 3 to create the storage capacitance.

A passivation layer 24 is deposited over an entire surface of the first substrate 20, and the pixel electrode 27, which is made of a transparent electrode, such as indium tin oxide (ITO), is formed on the passivation layer 24. In addition, a contact hole 27 is formed in the passivation layer 24 to electrically interconnect the drain electrode 17 of the TFT 10 (in FIG. 1) and the pixel electrode 28.

In FIG. 2, a black matrix 32 and a color filter layer 34 are formed on a second substrate 30. The black matrix 32 is formed within a portion the TFT 10 (in FIG. 1), and a portion of the black matrix 32 is formed between adjacent pixels (i.e., the gate line 3 and regions of the data line 5) to block light within regions where liquid crystal molecules of the liquid crystal material layer 40 are not activated, i.e., non-display regions. The color filter layer 34 includes red (R), blue (B), and green (G) color filter elements.

In general, the storage capacitance of the liquid crystal display device 1 improves sustaining characteristics of the voltage supplied to liquid crystal material layer 40, thereby stabilizing gray levels and reducing flicker and generation of residual images. Accordingly, storage capacitance of the liquid crystal display device is considered very important. In FIG. 2, the gate insulating layer 22 is sandwiched between overlapping portions of the gate line 3 and the metal layer 7, thereby creating the storage capacitance. Accordingly, an amount of the storage capacitance can be controlled by adjusting the area, i.e., width and length of the metal layer 7, of overlap between the gate line 3 and the metal layer 7.

With the advent of high resolution-liquid crystal display devices applicable of displaying high picture quality images, such as the high definition TVs (HDTVs), a size of each pixel should be very small. However, the overlap between the metal layer 7 and the gate line 3 is limited so as not to be greater than a set length. Accordingly, the overlap region of the gate line 3 and the metal layer 7 may be limited.

In order to generate sufficient amounts of the storage capacitance, the overlap region between the gate line 3 and the metal layer 7 is increased by increasing the widths of the gate line 3 and the metal layer 7 (since the length of the metal layer 7 is limited). Alternatively, an additional storage capacitance is created by forming two storage capacitor metal layers at other regions of a pixel (i.e., a central region of a pixel) to overlap with the gate line 3 even with the gate insulating layer remaining therebetween. However, increasing the width of the gate line 3 or forming the second metal layer reduces aperture ratio.

SUMMARY OF THE INVENTION

Accordingly, the present invention is directed to a liquid crystal display device and method of fabricating a liquid crystal display device that substantially obviates one or more of the problems due to limitations and disadvantages of the related art.

An object of the present invention is to provide a liquid crystal display device that creates a storage capacitance without deteriorating an aperture ratio.

Another object of the present invention is to provide a method of fabricating a liquid crystal display device that creates a storage capacitance without deteriorating an aperture ratio.

Another object of the present invention is to provide a liquid crystal display device having an increased overlap region of a gate line and a metal layer.

Another object of the present invention is to provide a method of fabricating a liquid crystal display device having an increased overlap region of a gate line and a metal layer.

Another object of the present invention to provide a thin film transistor having an improved electric mobility.

Another object of the present invention to provide a method of fabricating a thin film transistor having an improved electric mobility.

Another object of the present invention is to provide a liquid crystal display device having an improved aperture ratio.

Another object of the present invention is to provide a method of fabricating a liquid crystal display device having an improved aperture ratio.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, A liquid crystal display device includes a plurality of data lines arranged along a first direction on a substrate, a plurality of gate lines arranged a second direction perpendicular to the first direction on the substrate to define a plurality of pixel regions, each of the gate lines having at least one first set of protrusions and depressions, a driving device within each of the pixel regions, a pixel electrode within each of the pixel regions, and a metal layer overlapping each of the gate lines to create a storage capacitor.

In another aspect, a liquid crystal display device includes a plurality of data lines and gate lines arranged in a substrate to define a plurality of pixel regions, a thin film transistor within each pixel region and including a gate electrode on the substrate, a gate insulating layer on the substrate, a semiconductor layer on the gate insulating layer and having protrusions and depressions, a source electrode and a drain electrode on the semiconductor layer, a passivation layer on an entire surface of substrate, and a pixel electrode on the passivation layer.

In another aspect, a method of fabricating a liquid crystal display device includes forming a plurality of data lines arranged along a first direction on a substrate, forming a plurality of gate lines arranged a second direction perpendicular to the first direction on the substrate to define a plurality of pixel regions, each of the gate lines having at least one first set of protrusions and depressions, forming a driving device within each of the pixel regions, forming a pixel electrode within each of the pixel regions, and forming a metal layer overlapping each of the gate lines to create a storage capacitor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

In general, a storage capacitance C may be expressed by:

$$C = \varepsilon \times \frac{S}{d} \quad (1)$$

where $\varepsilon$ is a dielectric constant of an insulating layer between two conductive elements, i.e., a gate line and a storage capacitor metal layer, "d" is a width of the insulating layer, and S is an area of an overlap region between the gate line and the storage capacitor metal layer.

Accordingly, in Equation 1, increasing the storage capacitance C requires either an increase in the area of overlap S or a decrease in the width of the insulating layer "d," presuming that the dielectric constant $\varepsilon$ of the insulating layer is held constant. In a liquid crystal display device having a constant $\varepsilon$ insulating layer of a fixed thickness, the area of overlap S between the gate line and the metal layer must be increased in order increase an amount of the storage capacitance C. Thus, the area of overlap S may increase without increasing widths of the gate line and the metal layer, or a length of the metal layer.

According to the present invention, protrusions and depressions may be formed in the gate line and the metal layer to increase a surface area of the gate line and the metal layer, thereby increasing the overlap between the gate line and the metal layer. The protrusions and depressions may first be formed on a substrate, then the gate line and the metal layer may be formed on the protrusions and depressions. Furthermore, a groove may be formed into a surface of the substrate such that the gate line and the metal layer may be formed within the groove to form the protrusions and depressions.

Since operational characteristics of thin film transistors are relatively stable, control of the ON/OFF states is easy, and response time is fast, the TFTs may be used as active devices of liquid crystal display devices. Electric mobility of the TFTs may be determined by a ratio (w/l) of width (w) to length (l) of a channel formed in a semiconductor layer between source and drain electrodes. Accordingly, the length (l) and the width (w) of the channel may be adjusted to change the electric mobility of the TFT. For example, an interval between the source and drain electrodes may be reduced or the width of the semiconductor layer contacting the source and drain electrodes may be increased. However, it may not be possible to decrease the interval between the source and drain electrodes below a set, standard length such that the width of the semiconductor layer may be increased to improve the electric mobility of the TFT. However, if the width of the semiconductor layer increases, an overall area of the TFT also increases. Accordingly, an aperture ratio of the liquid crystal display device may deteriorate due to an increase of non-display regions shielded by a black matrix.

Figure 1:
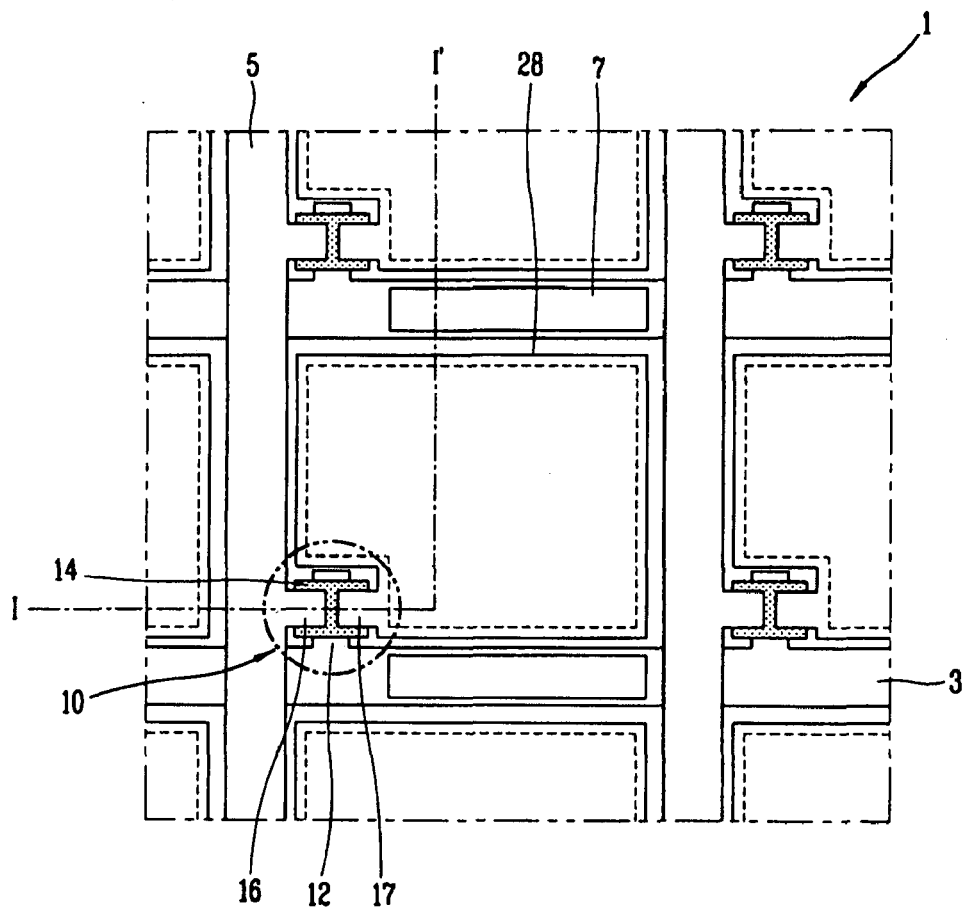
FIG. 1 is a plan view of a liquid crystal display device according to the related art.
Figure 2:
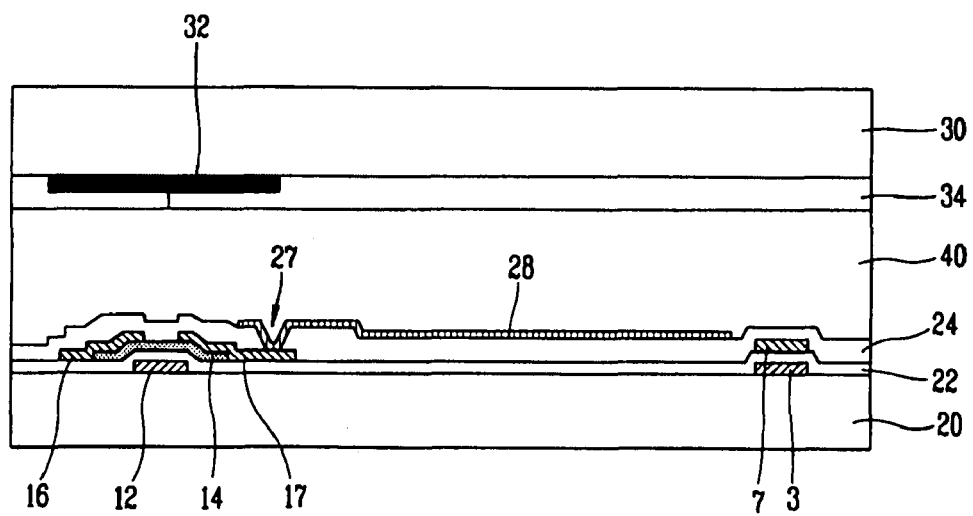
FIG. 2 is a cross sectional view along I–I' of FIG. 1 according to the related art.
Figure 3:
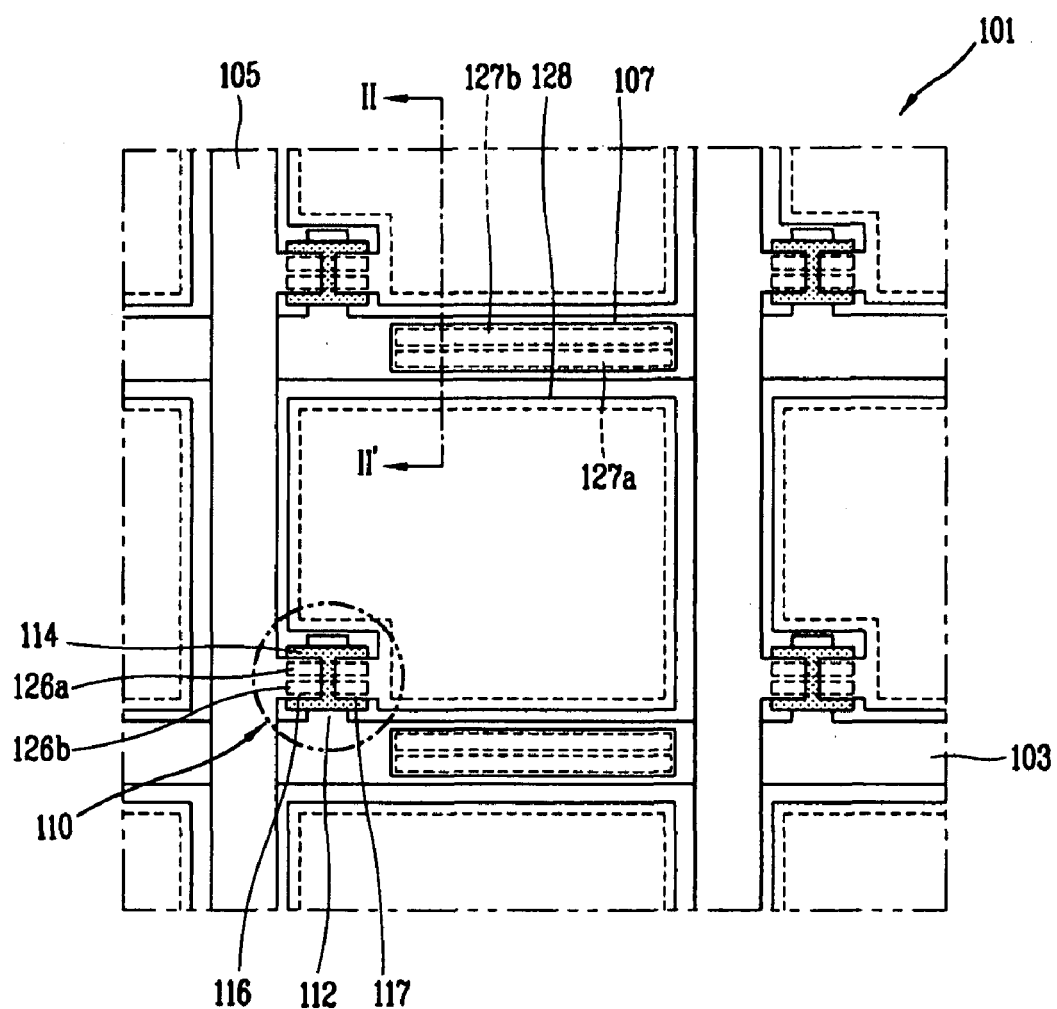
FIG. 3 is a plan view of an exemplary liquid crystal display device according to the present invention.

FIG. 3 is a plan view of an exemplary liquid crystal display device according to the present invention. In FIG. 3, a liquid crystal display device may include a pixel region defined by a gate line 103 disposed along a horizontal direction and a data line 105 disposed along a vertical direction, a TFT 110 that includes a gate electrode 112, a semiconductor layer 114 on the gate electrode 112 to be activated by a scan signal supplied to the gate electrode 112, a source electrode 116 and a drain electrode 117 on the semiconductor layer 114, and a pixel electrode 128 formed within the pixel region and electrically connected to the source electrode 116 and the drain electrodes 117 so that a signal may be supplied to the pixel electrode 128 when the semiconductor layer 114 is activated.

In addition, the liquid crystal display device may include at least first and second protrusion/depression layers 126a and 126b formed at a lower portion of the semiconductor layer 114 and a storage capacitor metal layer 107. The first and second protrusion/depression layers 126a and 126b may be arranged along a channel region formed between the source electrode 116 and the drain electrode 117 when the signal is supplied to the gate electrode 112, and the storage capacitor metal layer 107 may be arranged along the gate line 103. Accordingly, the storage capacitor metal layer 107 and the gate line 103 may be arranged along lower and upper portions of an insulating layer so that the storage capacitor metal layer 107 and the gate line 103 overlap each other to create a storage capacitance.

In FIG. 3, at least one third and fourth protrusion/depression layers 127a and 127b may be arranged along the horizontal direction of the gate line 103. Accordingly, since the third and fourth protrusion/depression layers 127a and 127b may be arranged along the horizontal direction of the gate line 103 at a lower portion of the gate line 103, the gate line 103 and the metal layer 107 may be formed on the third and fourth protrusion/depression layers 127a and 127b. Thus, protrusions and depressions may be formed in the gate line 103 and the metal layer 107, thereby increasing an area of overlap of the gate line 103 and the metal layer 107.

Figure 4A:
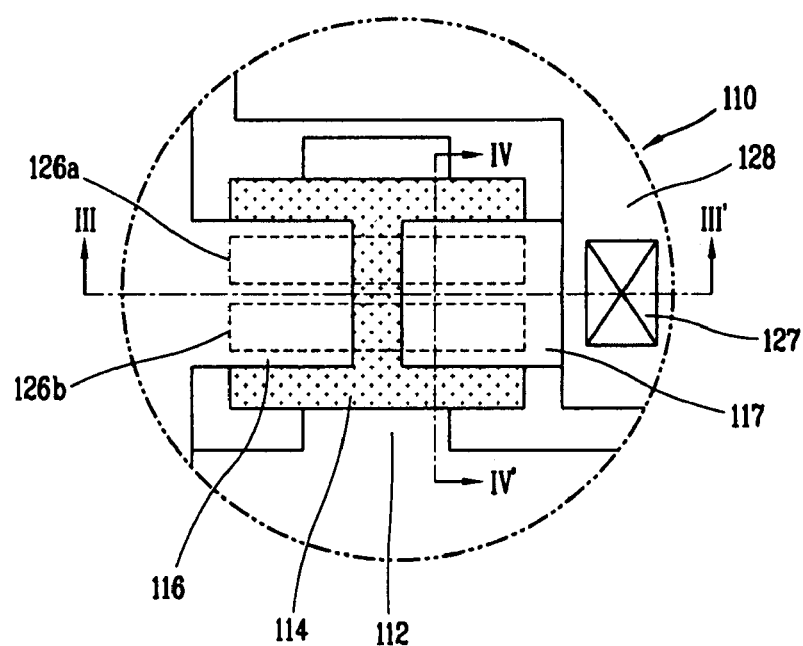
FIGS. 4A to 4C are enlarged plan and cross sectional views of an exemplary TFT device of FIG. 3 according to the present invention.
Figure 4B:
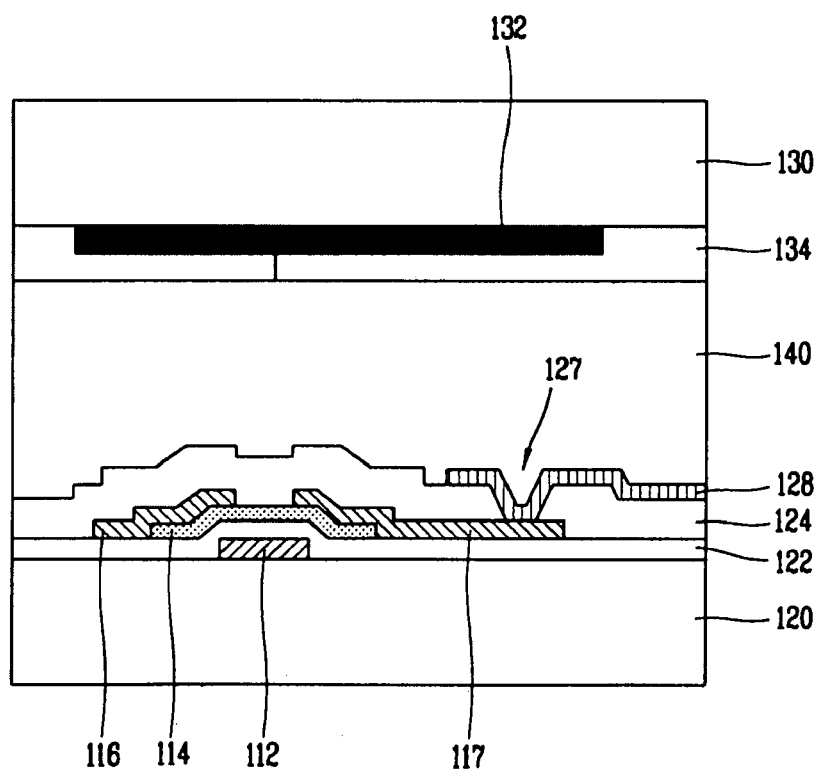
Figure 4C:
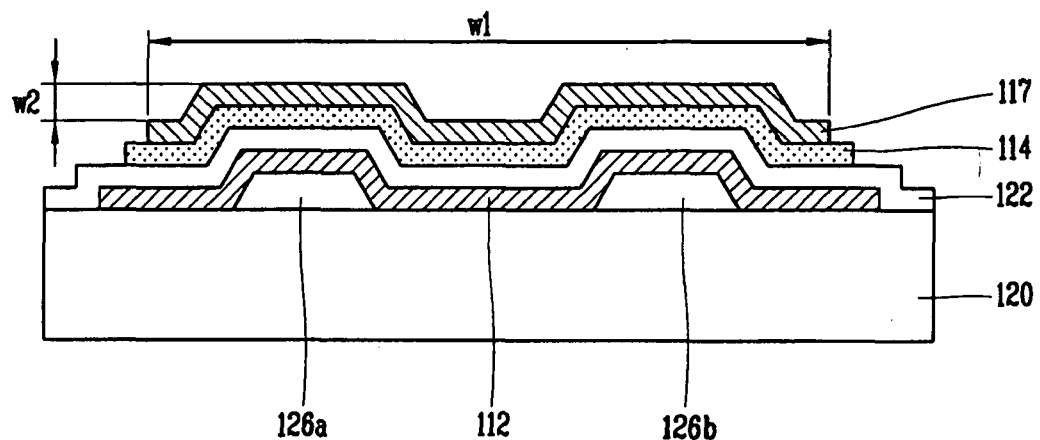

FIGS. 4A to 4C are enlarged plan and cross sectional views of an exemplary TFT device of FIG. 3 according to the present invention, wherein FIG. 4A is an enlarged-plan view, FIG. 4B is a cross sectional view along III–III' in FIG. 4A, and FIG. 4C is a cross sectional view along IV–IV' of FIG. 4A.

In FIG. 4A, the first and second protrusion/depression layers 126a and 126b may be arranged along the source electrode 116 and the drain electrode 117. Specifically, the first and second protrusion/depression layers 126a and 126b may be formed along the channel between the source electrode 116 and the drain electrode 117 when the signal is supplied to the gate electrode 112. Accordingly, the surface area of the semiconductor layer 114 may be increased by the first and second protrusion/depression layers 126a and 126b, wherein a width of the channel increases. Since a length of the channel between the source electrode 116 and the drain electrode 117 may remain fixed, electric mobility of the TFT 110 may improve due to the increased width increase of the channel.

In FIG. 4C, at least first and second protrusion/depression layers 126a and 126b may be formed on a first substrate 120, which may include transparent material(s), such as glass. The first and second protrusion/depression layers 126a and 126b may be formed by depositing insulating or metal material(s), then etching the material(s). The gate electrode 112 may be formed on the first and second protrusion/depression layers 126a and 126b, and may include a single material layer or a plurality of material layers formed by depositing metal material(s), such as Al, an Al alloy, and Cu, using evaporation or sputtering methods, and then etching the material(s) with an etchant. Accordingly, corresponding portions of the first and second protrusion/depression layers 126a and 126b cause protrusions and depressions to be formed in the gate electrode 112. Thus, the surface area of the gate electrode 112 increases than that of the related art.

The gate insulating layer 122 may be deposited on the gate electrode 112, and the semiconductor layer 114 may be formed on the gate insulating layer 122. The semiconductor layer 114 may be formed by depositing semiconductor material(s), such as a-Si, using a chemical vapor deposition (CVD) method, and then etching the semiconductor material(s) with an etchant. Since the protrusions and depressions are formed in the gate electrode 112 by the first and second protrusion/depression layers 126a and 126b on the first substrate 120, corresponding protrusions and depressions may also be formed in the gate insulating layer 122 and the semiconductor layer 114, thereby increasing the surface area of the gate insulating layer 122 and the semiconductor layer 114.

As shown in FIG. 4B, the source electrode 116 and the drain electrode 117 may be formed on portions of the semiconductor layer 114, and may both include a single material layer or a plurality of material layers formed by depositing metal material(s), such as Cr, Mo, Al, an Al alloy, and Cu, using evaporation or sputtering methods, and then etching the metal material(s) with an etchant. Accordingly, protrusions and depressions may also be formed on the source electrode 116 and the drain electrode 117 that correspond to the protrusions and depressions formed in the semiconductor layer 114. Thus, the surface area of the source electrode 116 and the drain electrode 117, and particularly the surface area contacting the semiconductor layer 114, may be increased.

The passivation layer 124 may be deposited on the first substrate 120 including the source electrode 116 and the drain electrode 117, and the pixel electrode 128, which may include transparent material(s), such as ITO, may be formed on the passivation layer 124. The pixel electrode 128 may electrically contact a portion of the drain electrode 117 of the TFT 110 through a contact hole 127 formed on the passivation layer 124.

In addition, the black matrix 132 and the color filter layer 134 may be formed on the second substrate 130 and the common electrode (not shown) may be formed on the color filter layer 134. A liquid crystal material layer 140 may be formed between the first and second substrates 120 and 130 using a liquid crystal material injection method for injecting the liquid crystal material between the first and second substrates 120 and 130 that have been previously attached together. Alternatively, the liquid crystal material layer 140 may be formed using a liquid crystal dispensing method for directly dispensing the liquid crystal material onto a surface of one of the first substrate 120 and the second substrate 130. Accordingly, uniform distribution of the liquid crystal material across an entire area between the first and second substrates 120 and 130 may be accomplished by applying pressure to one, or both of the first and second substrates 120 and 130.

Figure 5:
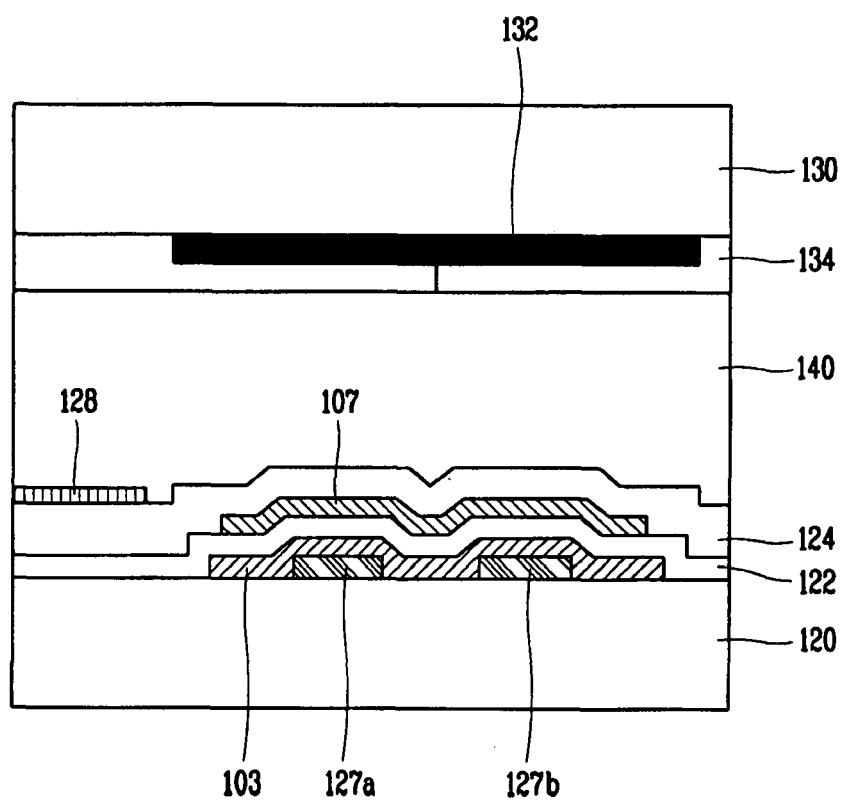
FIG. 5 is a cross sectional view along II–II' of FIG. 3 according to the present invention.

FIG. 5 is a cross sectional view along II–II' of FIG. 3 according to the present invention. In FIG. 5, the third and fourth protrusion/depression layers 127a and 127b may be formed on the first substrate 120. The third and fourth protrusion/depression layers 127a and 127b may be formed by depositing insulating or metal material(s) on the first substrate 120, and then etching the insulating or metal material(s). The gate line 103 (in FIG. 3) may be formed on the third and fourth protrusion/depression layers 127a and

127b, and may include of the same metal material(s) used to form the gate electrode 112 (in FIG. 3) using the same process. Alternatively, as shown in FIG. 3, it may also be possible to form the gate line 103 using metal material(s) different from the metal material(s) used to from the gate electrode 112, and methods used to form the gate line 103 may be different from methods used to form the gate electrode 112.

The gate insulating layer 122 may be deposited on the gate line 103, and the storage capacitor metal layer 107 may be formed on the gate insulating layer 122. The storage capacitor metal layer 107 may include a single material layer or a plurality of material layers formed by depositing metal material(s), such as Cr, Mo, Al, an Al alloy, and Cu, using evaporation or sputtering methods, and then etching the metal material(s) with an etchant. For example, the storage capacitor metal layer 107 may include the same metal material(s) used to form the source and drain electrodes 116 and 117 (in FIG. 3) using a single fabrication process. Alternatively, the storage capacitor metal layer 107 may include metal material(s) different from the material(s) used to form the source and drain electrodes 116 and 117, and the storage capacitor metal layer 107 may be formed using process(es) different from the process(es) used to from the source and drain electrodes 116 and 117.

Since the first and second protrusion/depression layers 126a and 126b (in FIG. 3) may be formed within the TFT region on the first substrate 120, protrusions and depressions may be formed in the layers including the gate electrode layer, the gate insulating layer, the semiconductor layer, and the source and drain electrode layers. Accordingly, the surface area of each of the layers may be increased. Thus, as shown in FIG. 4C, when the semiconductor layer 114 is activated by a signal supplied to the gate electrode 112 and the channel is formed along the surface of the semiconductor layer 114, an overall width of the channel may be calculated by adding a first width "w1" of the semiconductor layer 114 without the protrusions and depressions and a second width "w2" due to the increased surface area caused by the protrusions and depressions. In other words, the overall width of the channel may be increased by as much the second width "w2," as compared with the overall width of the channel of the liquid crystal display devices according to the related art.

Since the electric mobility of the TFT is proportional to the width of the channel and is inversely proportional to the length of the channel, and the overall width of the channel (w1+w2) is increased, the electric mobility of the TFT is increased because of the protrusions and depressions. Accordingly, it may be possible to fabricate a liquid crystal display device having improved operational characteristics when the TFT is fabricated having the increased channel width.

In addition, the increased electric mobility of the TFT improves the aperture ratio of the liquid crystal display device. For example, an overall area of the TFT may be reduced as the overall width of the channel is increased by the protrusions and depressions. Thus, the aperture ratio of the liquid crystal display device may be increased due to the reduction of the overall are of the TFT.

Furthermore, the protrusions and depressions may be formed in the gate line 103 due to the third and fourth protrusion/depression layers 127a and 127b that are arranged along the gate line 103. Accordingly, the surface area of the gate line 103 may be increased. Likewise, since the protrusions and depressions may be formed in the gate line 103, the gate insulating layer 122, which may be uniformly deposited on the gate line 103, may have corresponding protrusions and depressions, and the storage capacitor metal layer 107 may also have corresponding protrusions and depressions. Accordingly, the surface area of the storage capacitor metal layer 107 may be increased by the protrusions and depressions. As a result, the third and fourth protrusion/depression layers 127a and 127b may increase the surface area of the gate line 103 and the storage capacitor metal layer 107 that contact the gate insulating layer 122, whereby the area of the overlap region of the gate line 103 and the storage capacitor metal layer 107 may increase.

The first and second protrusion/depression layers 126a and 126b of the first substrate 120 may be formed along a horizontal direction between the source and drain electrodes 116 and 117, and the third and fourth protrusion/depression layers 127a and 127b may be formed along horizontal direction corresponding to the gate line 103. However, the first and second protrusion/depression layers 126a and 126b and the third and fourth protrusion/depression layers 127a and 127b may be formed differently. For example, each of the protrusion/depression layers 126a, 126b, 127a, and 127b may include more than two protrusions and depressions, and may be formed as a lattice structure having a predetermined size. In addition, the protrusion/depression layers may be formed in the gate electrode 112 or the gate insulating layer 122, not just on the lower substrate 120.

A shape of the protrusion/depression layers may differ. Furthermore, the protrusions and depressions may be formed on the semiconductor layer 114 and the gate insulating layer 122 to increase the surface areas of each of the different layers, increasing a channel width of the semiconductor layer 114. Accordingly, it may also be possible to form the protrusions and depressions by forming groove(s) in a surface of the first substrate.

Figure 6A:
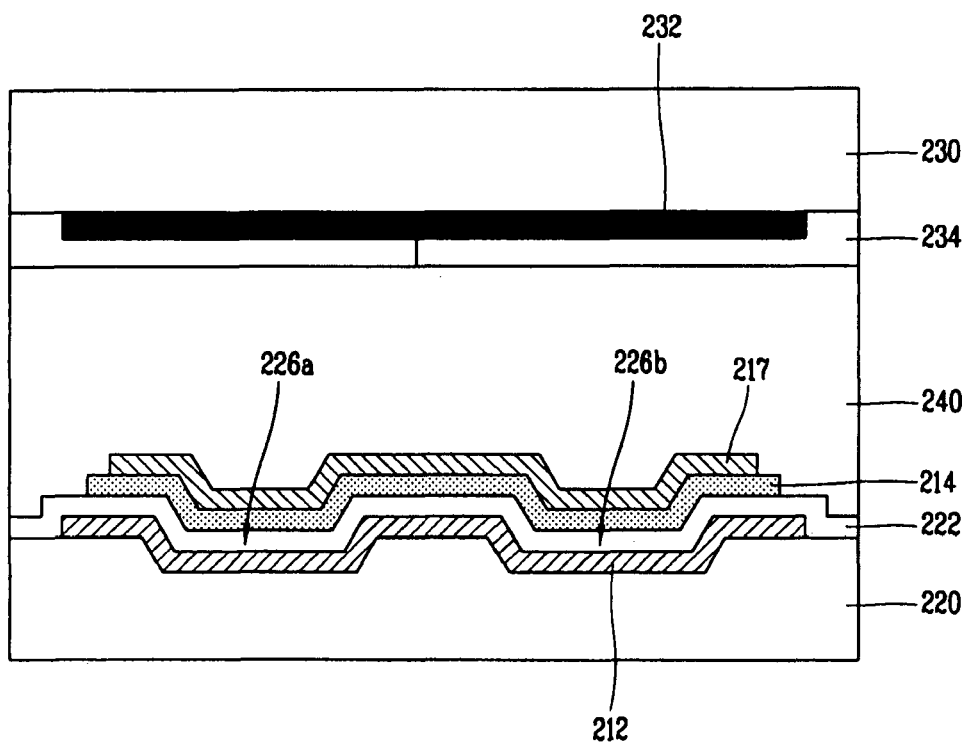
FIGS. 6A and 6B are cross sectional views of another exemplary liquid crystal display device according to the present invention.
Figure 6B:
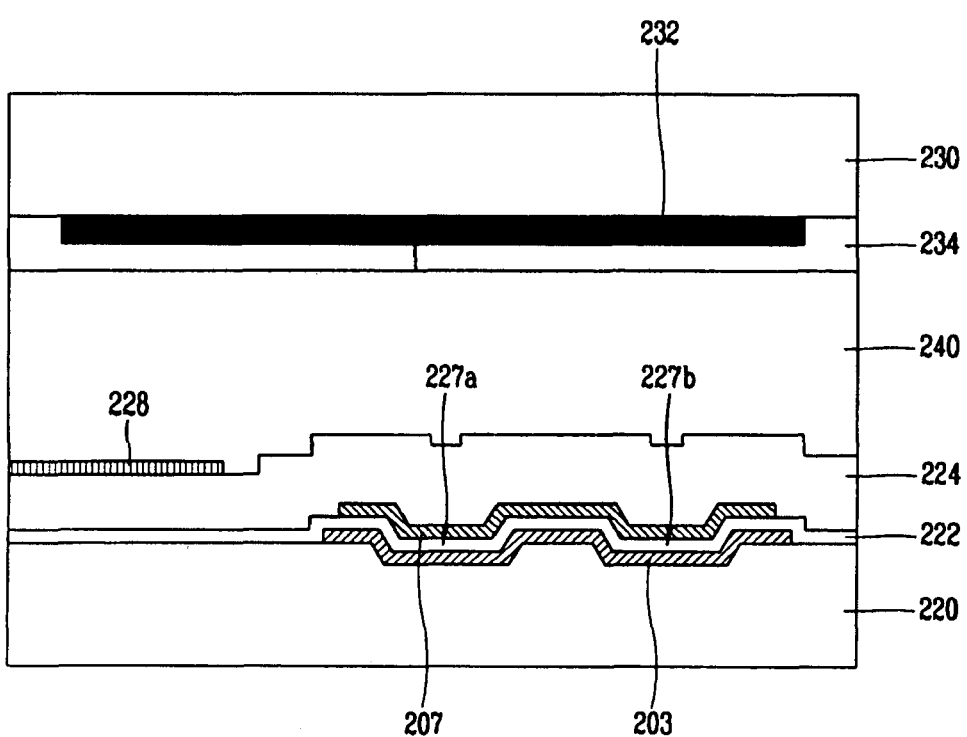

FIGS. 6A and 6B are cross sectional views of another exemplary liquid crystal display device according to the present invention. FIG. 6A is a cross sectional view along IV–IV' of FIG. 4A, and FIG. 6B is a cross sectional view along II–II' of FIG. 3. In FIG. 6B, a width of a channel and an overlap region between a gate line 203 and a metal layer 207 may be increased using a groove formed in a surface of a first substrate 220. In FIG. 6A, at least one first set of grooves 226a and 226b may be formed in the surface of the first substrate 220, and a gate electrode 212 may be formed within the first set of grooves 226a and 226b. A gate insulating layer 222 may be formed over an entire surface of the first substrate 220 including the gate electrode 212, a semiconductor layer 214, and a drain electrode 217 formed on the semiconductor layer 214.

Accordingly, the semiconductor layer 214 formed on the first substrate 220 may include protrusions and depressions due to the first set of grooves 226a and 226b formed in the surface of the first substrate 220. When the signal is supplied to the gate electrode 212, a width of the channel along the surface of the semiconductor layer 214 may be increased to increase the electric mobility of the TFT.

Furthermore, as shown in FIG. 6B, at least one second set of grooves 227a and 227b may formed in the surface of the first substrate 220, and the gate line 203 may be formed within the second set of grooves 227a and 227b. The gate insulating layer 222 may be deposited on the gate line 203, and a storage capacitor metal layer 207 may be formed on the insulating layer 222 to create a storage capacitance between the storage capacitor metal layer 207 and the gate line 203.

The gate line 203 and the gate insulating layer 222 may include corresponding protrusions and depressions due to the second set of grooves 227a and 227b formed in surface of the first substrate 220. Accordingly, an overlap region of the gate line 203 and the storage capacitor metal layer 207 may increase, thereby increasing a storage capacitance without increasing the width of the storage capacitor metal layer 207.

Figure 7A:
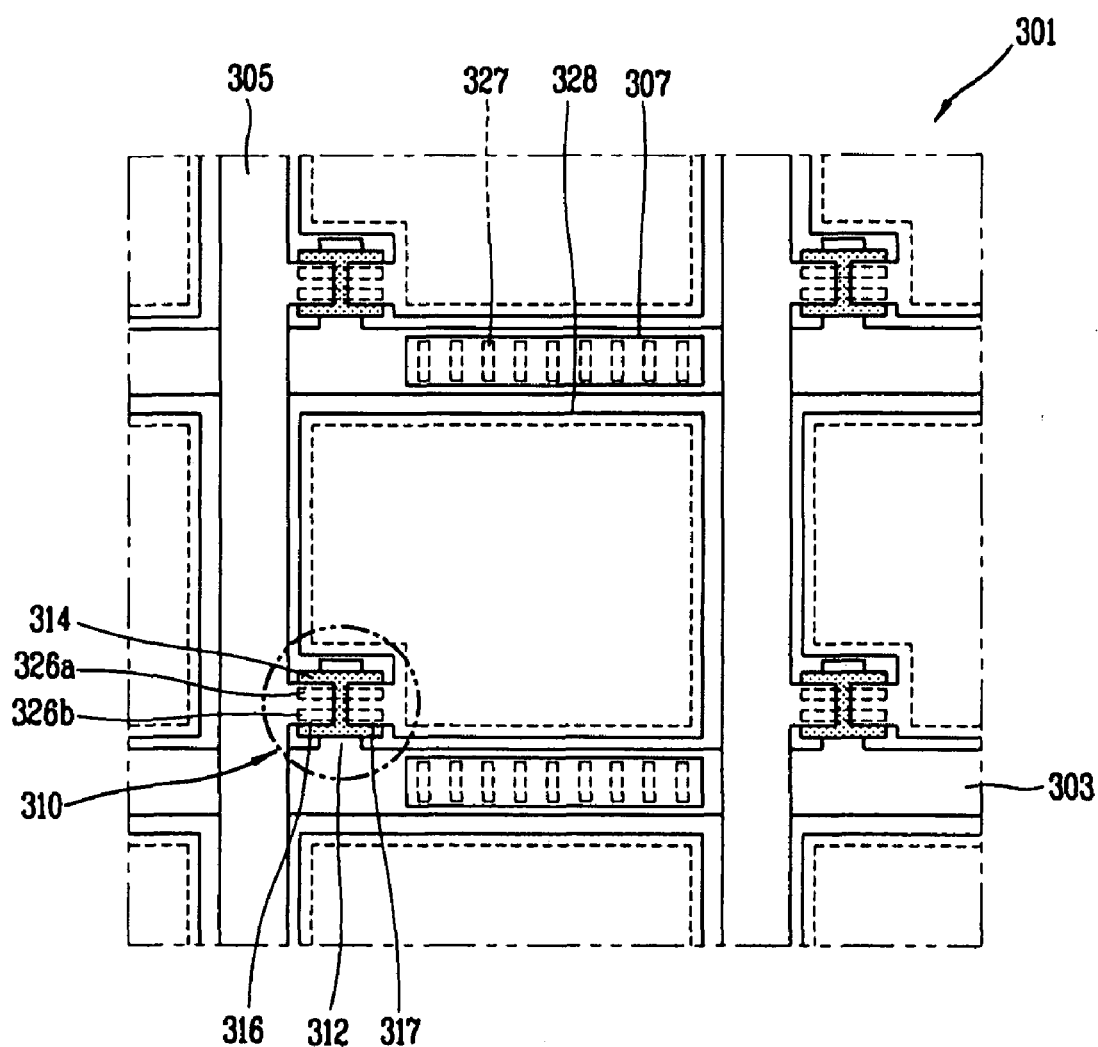
FIGS. 7A and 7B are plan views of another exemplary liquid crystal display device according to the present invention.
Figure 7B:
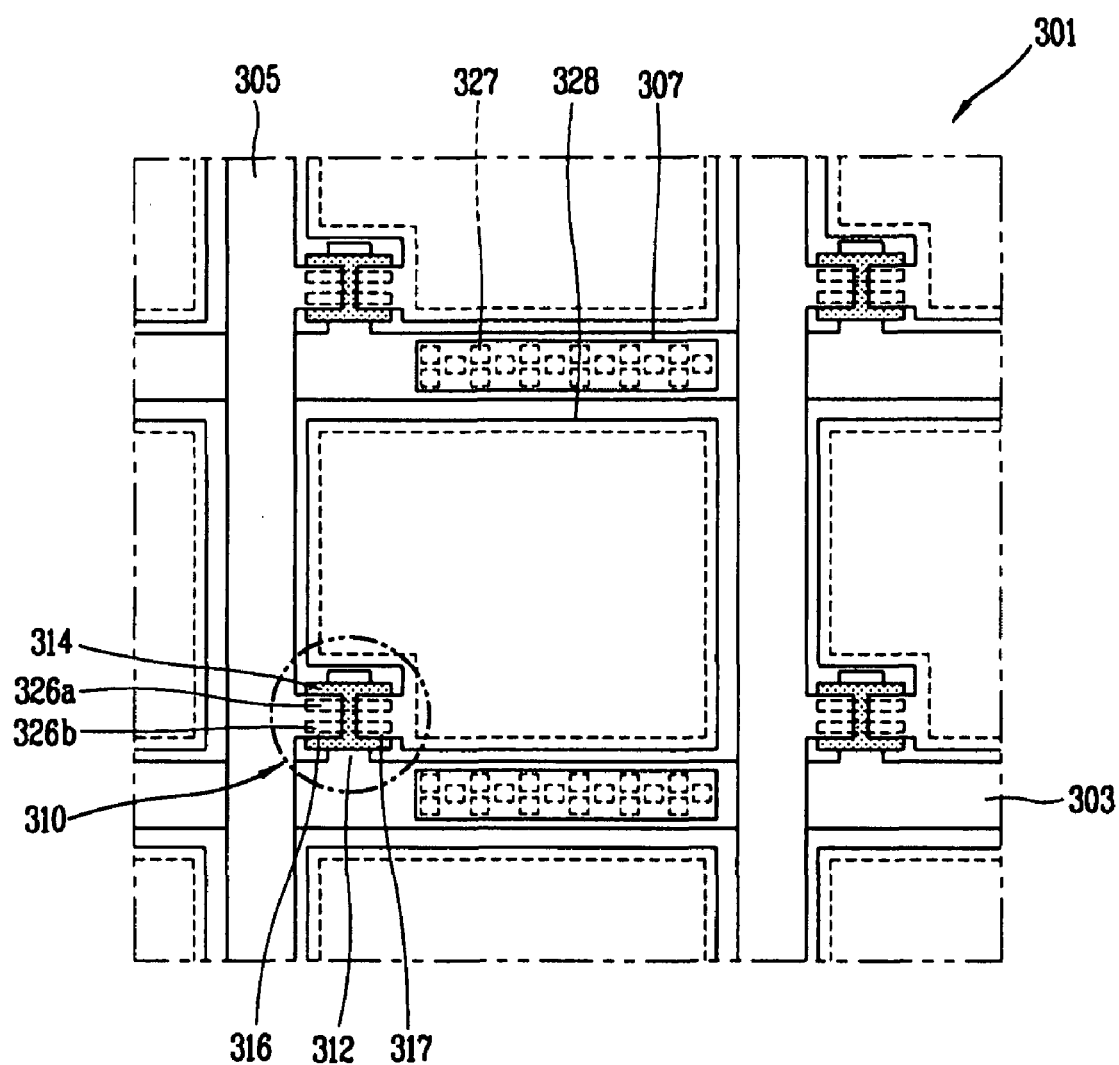

FIGS. 7A and 7B are plan views of another exemplary liquid crystal display device according to the present invention.

The structures shown in FIGS. 7A and 7B may be similar to those in FIG. 3, except for protrusions and depressions formed in the first substrate and structures of a gate line 303 and a storage capacitor metal layer 307. In FIG. 7A, at least one second protrusion/depression layer 327 may be formed in the first substrate to extend along a direction corresponding to the data line 305. At least one second protrusion/depression layer 327 may include a plurality of second protrusions/depressions disposed along a direction corresponding to the gate line 303.

In FIG. 7B, a second protrusion/depression layer 327 may be arranged along a direction corresponding to the gate line 303. The second protrusion/depression layer 327 may include a plurality of protrusions/depressions disposed in a lattice configuration and having a predetermined size.

Although not shown in FIGS. 7A and 7B, the protrusion/depression layers may be formed having different shapes. For example, if the overlap region between the gate line 303 and the storage capacitor metal layer 307 is increased, the protrusions and depressions may be formed having almost any shape. In addition, although not shown, the first protrusion/depression layer 316 may be formed within the TFT region and may be formed having various shapes (i.e., a lattice shape), as well as the second protrusion/depression layer 327.

It will be apparent to those skilled in the art that various modifications and variations may be made in the liquid crystal display device and method of fabricating a liquid crystal display device of the present invention without departing from the spirit or scope of the invention. Thus, it is intended that the present invention cover the modifications and variations of this invention provided they come within the scope of the appended claims and their equivalents.

What is claimed is:

1. A liquid crystal display device, comprising:
   a plurality of data lines arranged along a first direction on a substrate;
   a plurality of gate lines arranged along a second direction perpendicular to the first direction on the substrate to define a plurality of pixel regions, each of the gate lines having at least one first set of protrusions and depressions extending in a direction substantially perpendicular to a surface of the substrate on which the gate lines are arranged;
   a driving device within each of the pixel regions;
   a pixel electrode within each of the pixel regions; and
   a metal layer overlapping each of the gate lines to create a storage capacitor, the metal layer having at least one set of protrusions and depressions extending in a direction substantially perpendicular to a surface of the substrate on which the metal layer is arranged.

2. The device according to claim 1, wherein the first set of protrusions and depressions is arranged along the second direction of the gate lines.

3. The device according to claim 2, wherein the first set of protrusions and depressions are arranged along the first direction of the data lines.

4. The device according to claim 2, wherein the first set of protrusions and depressions are arranged having a lattice shape.

5. The device according to claim 1, wherein the driving device includes a thin film transistor.

6. The device according to claim 5, wherein the thin film transistor includes:
   a gate electrode on the substrate;
   a gate insulating layer over the substrate;
   a semiconductor layer on the gate insulating layer; and
   a source electrode and a drain electrode on the semiconductor layer.

7. The device according to claim 6, further comprising at least one first protrusion/depression layer on the substrate to form the first set of protrusions and depressions.

8. The device according to claim 7, wherein the first protrusion/depression layer includes metal material.

9. The device according to claim 7, wherein the first protrusion/depression layer includes insulation material.

10. The device according to claim 6, further comprising at least one first groove formed within a surface of the substrate to form the first set of protrusions and depressions.

11. The device according to claim 6, wherein the metal layer is disposed on the gate insulating layer.

12. The device according to claim 11, wherein the metal layer includes metal material similar to metal material of the source electrode and the drain electrode.

13. The device according to claim 6, further comprising a second set of protrusions and depressions in the semiconductor layer.

14. The device according to claim 13, wherein the second set of protrusions and depressions is formed along the source electrode and the drain electrode.

15. The device according to claim 13, wherein the second set of protrusions and depressions is arranged in a lattice shape.

16. The device according to claim 13, further comprising a second protrusion/depression layer in the substrate to form the second set of protrusions and depressions.

17. The device according to claim 16, wherein the second protrusion/depression layer includes insulation material.

18. The device according to claim 16, wherein the second protrusion/depression layer includes metal material.

19. The device according to claim 13, further comprising a second groove formed in a surface of the substrate to form the second set of protrusions and depressions.

20. A method of fabricating a liquid crystal display device, comprising:
   forming a plurality of data lines arranged along a first direction on a substrate;
   forming a plurality of gate lines arranged along a second direction perpendicular to the first direction on the substrate to define a plurality of pixel regions, each of the gate lines having at least one first set of protrusions and depressions extending in a direction substantially perpendicular to a surface of the substrate on which the gate lines are arranged;
   forming a driving device within each of the pixel regions;
   forming a pixel electrode within each of the pixel regions; and
   forming a metal layer overlapping each of the gate lines to create a storage capacitor, the metal layer having at least one set of protrusions and depressions extending in a direction substantially perpendicular to a surface of the substrate on which the metal layer is arranged.

21. The method according to claim 20, wherein the first set of protrusions and depressions is arranged along the second direction of the gate lines.

22. The method according to claim 21, wherein the first set of protrusions and depressions are arranged along the first direction of the data lines.

23. The method according to claim 21, wherein the first set of protrusions and depressions are arranged having a lattice shape.

24. The method according to claim 20, wherein the driving device includes a thin film transistor.

25. The method according to claim 24, wherein the thin film transistor includes:
a gate electrode on the substrate;
a gate insulating layer over the substrate;
a semiconductor layer on the gate insulating layer; and
a source electrode and a drain electrode on the semiconductor layer.

26. The method according to claim 25, further comprising forming at least one first protrusion/depression layer on the substrate to form the first set of protrusions and depressions.

27. The method according to claim 26, wherein the first protrusion/depression layer includes metal material.

28. The method according to claim 26, wherein the first protrusion/depression layer includes insulation material.

29. The method according to claim 25, further comprising forming at least one first groove within a surface of the substrate to form the first set of protrusions and depressions.

30. The method according to claim 25, wherein the metal layer is disposed on the gate insulating layer.

31. The method according to claim 30, wherein the metal layer includes metal material similar to metal material of the source electrode and the drain electrode.

32. The method according to claim 25, further comprising forming a second set of protrusions and depressions in the semiconductor layer.

33. The method according to claim 32, wherein the second set of protrusions and depressions is formed along the source electrode and the drain electrode.

34. The method according to claim 33, wherein the second set of protrusions and depressions is arranged in a lattice shape.

35. The method according to claim 32, further comprising forming a second protrusion/depression layer in the substrate to form the second set of protrusions and depressions.

36. The method according to claim 35, wherein the second protrusion/depression layer includes insulation material.

37. The method according to claim 35, wherein the second protrusion/depression layer includes metal material.

38. The method according to claim 32, further comprising forming a second groove in a surface of the substrate to form the second set of protrusions and depressions.

* * * * *